United States Patent

Shor et al.

Patent Number: 6,034,001
Date of Patent: Mar. 7, 2000

[54] METHOD FOR ETCHING OF SILICON CARBIDE SEMICONDUCTOR USING SELECTIVE ETCHING OF DIFFERENT CONDUCTIVITY TYPES

[75] Inventors: Joseph S. Shor, Flushing, N.Y.; Anthony D. Kurtz, Teaneck; David Goldstein, Edison, both of N.J.

[73] Assignee: Kulite Semiconductor Products, Inc., Leonia, N.J.

[21] Appl. No.: 08/198,511

[22] Filed: Feb. 17, 1994

Related U.S. Application Data

[63] Continuation of application No. 07/777,157, Oct. 16, 1991, abandoned.

[51] Int. Cl.[7] .......................... H01L 23/48; H01L 23/52; H01L 29/40

[52] U.S. Cl. ...................... 438/931; 438/695; 438/165; 257/769; 257/770; 257/915

[58] Field of Search ................................. 205/221, 223; 257/619, 915; 204/129.3

[56] References Cited

U.S. PATENT DOCUMENTS

| | | | |
|---|---|---|---|
| 3,078,219 | 2/1963 | Chang | 204/129.3 |
| 4,369,099 | 1/1983 | Kohl et al. | 204/129.3 |
| 4,414,066 | 11/1983 | Forrest et al. | 204/129.3 |
| 5,049,975 | 9/1991 | Ajika et al. | 257/915 |
| 5,182,420 | 1/1993 | Steitz et al. | 257/915 |

*Primary Examiner*—Mahshid Saadat
*Assistant Examiner*—Jhihan B Clark
*Attorney, Agent, or Firm*—Arthur L. Plevy; Buchanan Ingersoll

[57] ABSTRACT

A method for selective conductivity etching of a silicon carbide (SiC) semiconductor includes forming a p-type SiC layer on a substrate layer, forming an n-type SiC layer on the p-type SiC layer, and photoelectrochemically etching selected portions of the n-type SiC layer by applying a bias voltage to the n-type SiC layer in a hydrofluoric acid (HF) solution while exposing the layer to a pattern of UV light. The bias potential is selected so that the n-type SiC layer will photo-corrode and the p-type SiC layer will be inert and act as an etch stop. The light pattern exposure of the n-type SiC layer may be done by applying a photolithographic mask to the layer, by projecting a collimated light beam through a patterned mask, or by scanning with a focused micrometer-sized laser beam on the semiconductor surface.

5 Claims, 10 Drawing Sheets

SiC/ELECTROLYTE INTERFACE
AT V = 0 Vsce n-TYPE β-SiC

BAND-BENDING ≈ 0.5V

AQUEOUS HF SOLUTION p-TYPE β-SiC

BAND-BENDING ≈ −1.5V

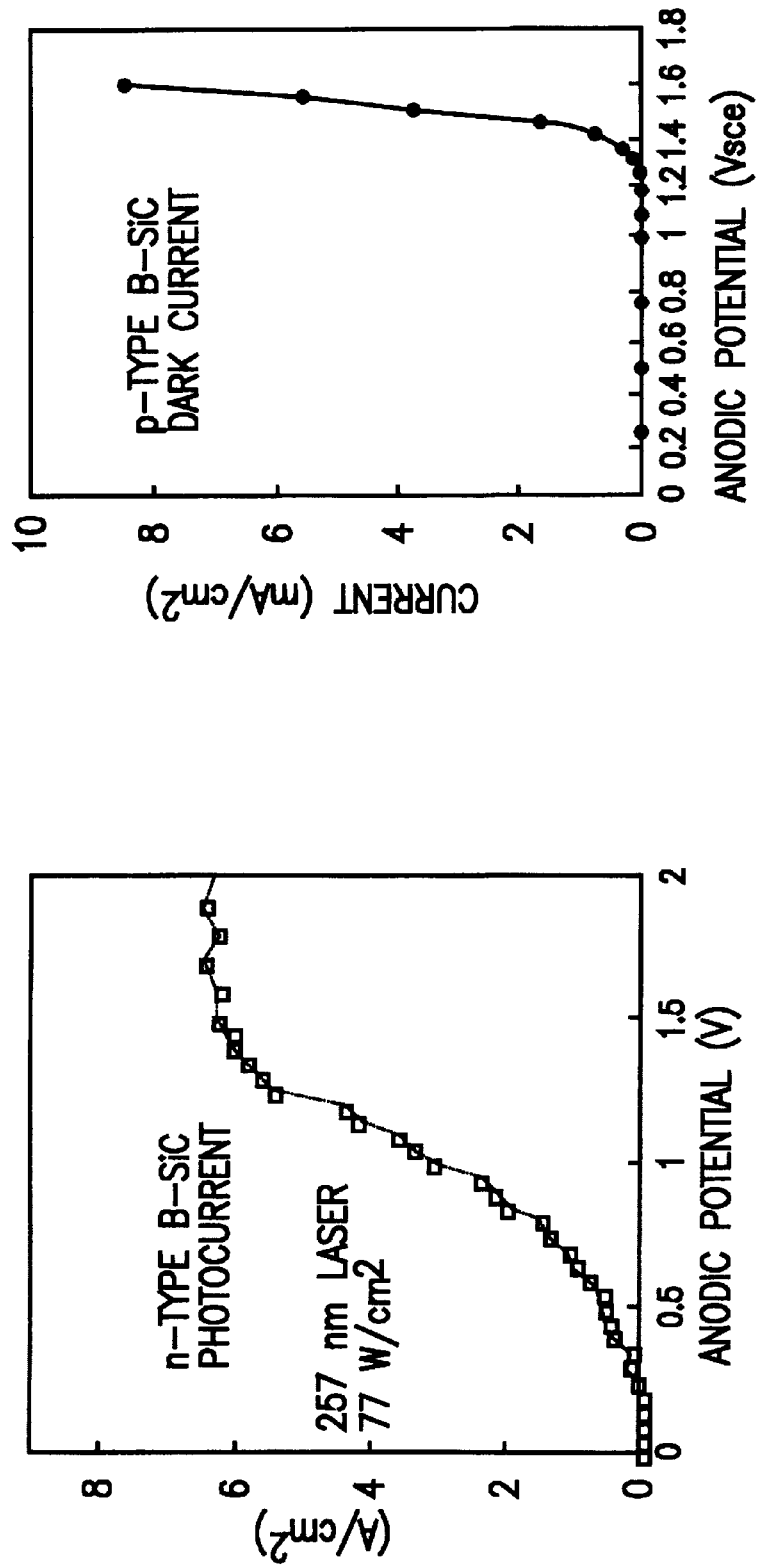

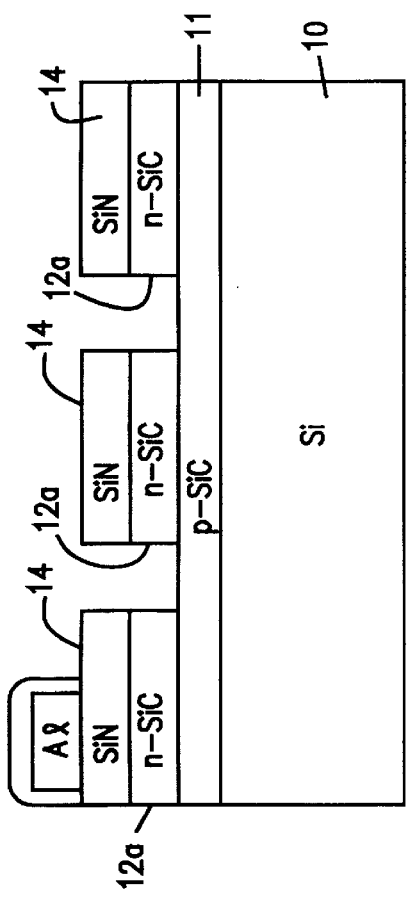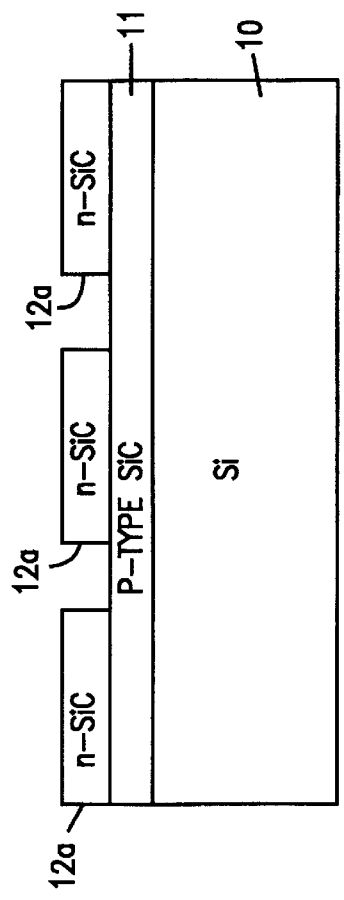
FIG. 5D
FIG. 5E

METHOD FOR ETCHING OF SILICON CARBIDE SEMICONDUCTOR USING SELECTIVE ETCHING OF DIFFERENT CONDUCTIVITY TYPES

This is a Continuation, of application Ser. No. 07/777,157, filed Oct. 16, 1991 abandoned.

FIELD OF INVENTION

The present invention relates to an improved method for etching silicon carbide (Sic) semiconductors, and particularly, to an etching method using selective etching of different conductivity types of β-SiC.

BACKGROUND OF THE INVENTION

There has been a considerable amount of interest in silicon carbide (Sic) semiconductors recently due to breakthroughs which have made single crystals attainable, for example, as described in the article entitled "Growth and Characterization of Cubic SiC Single Crystal Films on Silicon", by J. A. Powell, L. G. Matus, and M. A. Kuczmarski in Journal of Electrochemical Society, Vol. 134, No. 6, pp. 1558–1565, June 1987. SiC has a wide bandgap (2.2 eV for β-SiC), a high melting point (2800 degrees C.) and a large thermal conductivity, making it an excellent semiconductor for high temperature applications. Recent research has shown that β-SiC has excellent properties for use as a sensing element for piezoresistive transducers. Such high temperature SiC transducers are described in the related U.S. patent application Ser. No. 07/694,490, entitled "High Temperature Transducers and Methods of Fabricating The Same Employing Silicon Carbide", filed on May 2, 1991, and assigned to Kulite Semiconductor Products, Inc., in common with the present application, which is incorporated by reference herein. This patent addresses two issues in the fabrication of SiC pressure sensors and other devices, namely, etching and metallization.

There have been previous attempts to etch SiC using reactive ion etching, plasma etching, and photoelectrochemical etching. For example, reactive ion and plasma etching of SiC are described in the article entitled "Dry Etching of β-SiC in $CF_4$ and $CF_4+O_2$ Mixtures", by J. W. Palmour, R. F. Davis, T. M. Wallett, and K. B. Bhasin, in Journal of Vacuum Science Technology, Vol. 4, No. 3, published May/June 1986. Photoelectrochemical etching of n-type β-SiC under ultraviolet (UV) illumination in hydrofluoric acid (HF) solution is described in a previous paper by the authors of the present invention, entitled "Surface Micromachining of β-SiC Using Laser Controlled Photoelectrochemical Etching" in "Amorphous and Crystalline SiC III", to be published by Springer/Verlag in 1991. However, none of these etching processes employed any selective etching of different conductivity types of SiC. Conductivity selective etching is extremely important for sensor fabrication. The use of conductivity selective etch stop allows for the precise fabrication of thin membranes. These membranes can act as the force collector in an integrated transducer.

Techniques have been proposed for selective etching of a semiconductor layer using an epitaxially grown stop layer or ion-implanted barrier layer that does not dissolve in a selected etching solution, and resistivity gradient limiting etching through different rates of anodically dissolving an n-type silicon layer on a p-type silicon substrate. See, for example, the article entitled "The Fabrication of Thin, Freestanding, Single-Crystal, Semiconductor Membranes", by K. C. Lee, in Journal of Electrochemical Society, Vol. 137, No. 8, August 1990. However, these prior techniques have not been applied to selective etching of different conductivity types of SiC.

SUMMARY OF THE INVENTION

In accordance with the present invention, a method for selective conductivity etching of a silicon carbide (SiC) semiconductor comprises the steps of forming a first layer of a first conductivity type of SiC on a substrate layer, forming a second layer of a second conductivity type of SiC on the first layer of first conductivity type SiC, wherein said second conductivity type SiC is characterized by a substantially lower voltage characteristic for charge transport at its surface in an electrolyte etching solution, and etching selected portions of the second layer of second conductivity type SiC by placing the semiconductor in an electrolyte etching solution while exposing the second layer to a pattern of light illumination for generating charge holes in the selected portions of the second layer to be etched.

In the preferred form of the selective etching method of the present invention, the first layer is made of p-type β-Sic, the second layer is made of n-type β-SiC, and the second layer is biased through an ohmic contact applied thereto at a selected bias potential, relative to a reference electrode applied to the electrolyte, such that the n-type β-SiC layer will photo-corrode and the p-type β-Sic layer will be inert and act as an etch stop. The electrolyte etching solution contains hydrofluoric (HF) acid, and the light illumination is preferably ultraviolet (UV) light. The light pattern exposure of the n-type β-SiC layer may be done by applying a photolithographic mask to the selected portions of the layer made of masking material resistant to the HF electrolyte and UV illumination, by projecting a collimated light beam through a patterned mask and imaging the mask on the semiconductor surface, or by scanning with a focused micrometer-sized beam for "direct-writing" on the semiconductor surface.

BRIEF DESCRIPTION OF THE DRAWINGS

The above objects and further features and advantages of the invention are described in detail below in conjunction with the drawings, of which:

FIGS. 2A and 2B are current density diagrams showing anodic currents generated for n-type and p-type SiC semiconductors, respectively, at a range of biasing potentials.

FIGS. 5A–5E illustrate the successive stages of the processing of a SiC semiconductor in accordance with the present invention, beginning with epitaxially growing n-type and p-type SiC layers, application of a metal contact, masking with a photolithographic pattern mask, photoelectrochemically etching the pattern in the n-type SiC layer, and obtaining the completed pattern-etched SiC semiconductor.

BEST MODE OF PRACTICING THE INVENTION

There has been a considerable amount of interest in SiC devices due to recent breakthroughs in obtaining single crystals of beta silicon carbide (β-SiC) and alpha silicon carbide (α-SiC) semiconductors. SiC semiconductors have a wide bandgap (2.2 eV for β-SiC and 3 eV for α-SiC), a high melting point (2800 degrees C.) and a large thermal conductivity. These factors make SiC an excellent semiconductor for high temperature applications. In addition, SiC is a structurally stronger material than silicon, making it better for high temperature mechanical applications. Reference is made to the previously described article by J. A. Powell et al. for an extensive bibliography on using SiC in various applications and for processing SiC.

The present invention is directed to an improved process for selective conductivity etching of a SiC semiconductor using SiC layers of different conductivity types. In accordance with the invention, a first layer of a first conductivity type of SiC is formed on a substrate layer, a second layer of a second conductivity type of SiC is formed on the first layer, wherein the second conductivity type SiC is characterized by a substantially lower voltage characteristic for charge transport at its surface in a given electrolyte etching solution, and selected portions of the second layer are etched in an electrolyte etching solution while being exposed to a light pattern for generating charge holes in the second layer. In the following description, the preferred mode of etching an n-type β-Sic layer on a p-type β-SiC layer in a photoelectrochemical cell using a photolithographic mask is described. However, the broad principles of the invention are applicable to other types of SiC semiconductor materials and to other techniques for pattern etching.

Figure 1A:
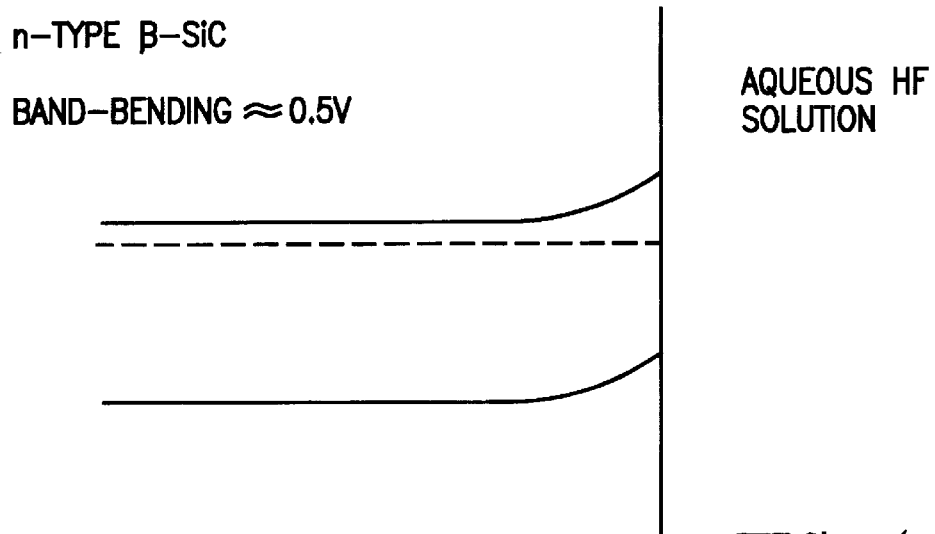
FIGS. 1A and 1B are band voltage diagrams showing the difference in voltage characteristic for charge transport at the surface interface with an electrolyte solution of an n-type SiC semiconductor and a p-type SiC semiconductor, respectively.
Figure 1B:
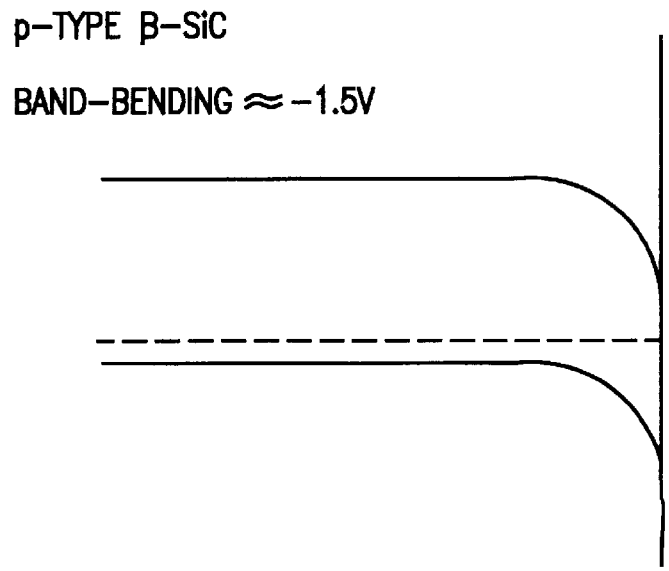

In the previous paper mentioned, the current authors characterized the photoelectrochemical etching of n-type β-SiC under UV illumination in HF solutions and analyzed the electrochemistry involved in the process. C–V curves measured in that study suggested that the flat-band voltage of n-type β-SiC in 2.5% HF (aq) is −0.55 $V_{sce}$. Since the flat-band voltage is fairly independent of frequency over the range 0.5–20 kHz, it is assumed that all of the potential drop takes place over the space charge layer of the semiconductor. Under this condition, the position of the band edges at the surface with respect to the Fermi level will be the same for both n- and p-type materials, thus leading to a very different band bending for the two conductivity types. This result is depicted in FIGS. 1A and 1B, which shows the SiC/ electrolyte interface of n- and p-type β-SiC at a potential of 0 $V_{sce}$ in dilute HF. At this potential, the bands of n-SiC bend upwards to the surface, while those of p-SiC extend downwards. From the values of the flat band voltage of n-SiC in solution, the bandgap, and the position of the Fermi levels in n- and p-type with respect to the band edges (these can be calculated approximately from the carrier concentration), it is possible to determine the degree of bandbending of p-SiC in FIG. 1b. This calculation is done by imposing the condition that the Fermi level position at the semiconductor surface will be the same for both n- and p-type SiC. Assuming $E_c−E_f=100$ meV for n-SiC and $E_f−E_v≈50$ meV for p-SiC, the bandbending of p-SiC is ≈1.5 V at V=0 $V_{sce}$ (e.g. FIG. 1b), which suggests that the flat band voltage of p-SiC in this HF solution is ≈1.5 $V_{sce}$.

The voltage difference $V_{fb}$ between the flat-band level and the band-bending at the surface for n-type and p-type SiC will result in a difference in charge transport characteristic across the semiconductor/electrolyte junction. In the p-type SiC semiconductor, dark or photo-etching will occur at much higher potentials than in photo-etch n-type material. Maintaining the SiC semiconductor surface at a potential which is lower than the flat band voltage of p-SiC and higher than the flat band voltage of n-SiC will therefore result in the n-type SiC layer undergoing anodic dissolution under photo-etch while the p-type SiC layer remains inert. In other words, a suitable bias potential may be applied to the n-type material, through an ohmic contact, to allow it to be electrochemically etched while the p-type material acts as an etch stop. This is equally applicable to 6H or α-SiC as it is to β-SiC (3C-SiC). Our results have shown that in 6H-SiC, the i–V curves indicate that the flat band voltage of n-type material is ≈−0.5 $V_{sce}$. Therefore, following the same analysis we described for β-SiC, n-type-6H-SiC grown on p-type 6H-SiC can be selectively etched, with the p-type layer acting as an etch-stop at potentials between −0.5 to +2.5 $V_{sce}$. This is a broader potential range than β-SiC since 6H-SiC has a wider bandgap (3.0 eV compared to 2.2 eV for p-SiC). In fact, we have demonstrated etch rates as high as 6000 Å/min. for n-type 6H-SiC in this potential range using a collimated Hg lamp as the light source.

Since the dissolution of SiC in electrolyte etching solution takes place through anodic oxidation, the presence of charge holes at the surface is necessary for catalysis to occur. These holes can be supplied from the bulk, i.e., in p-type material, or can be photogenerated by light illumination. Light illumination serves the dual purposes of allowing light patterning techniques to be used for forming desired structures in the n-type SiC surface and for generating holes for the photoelectrochemical etching.

Figure 5A:
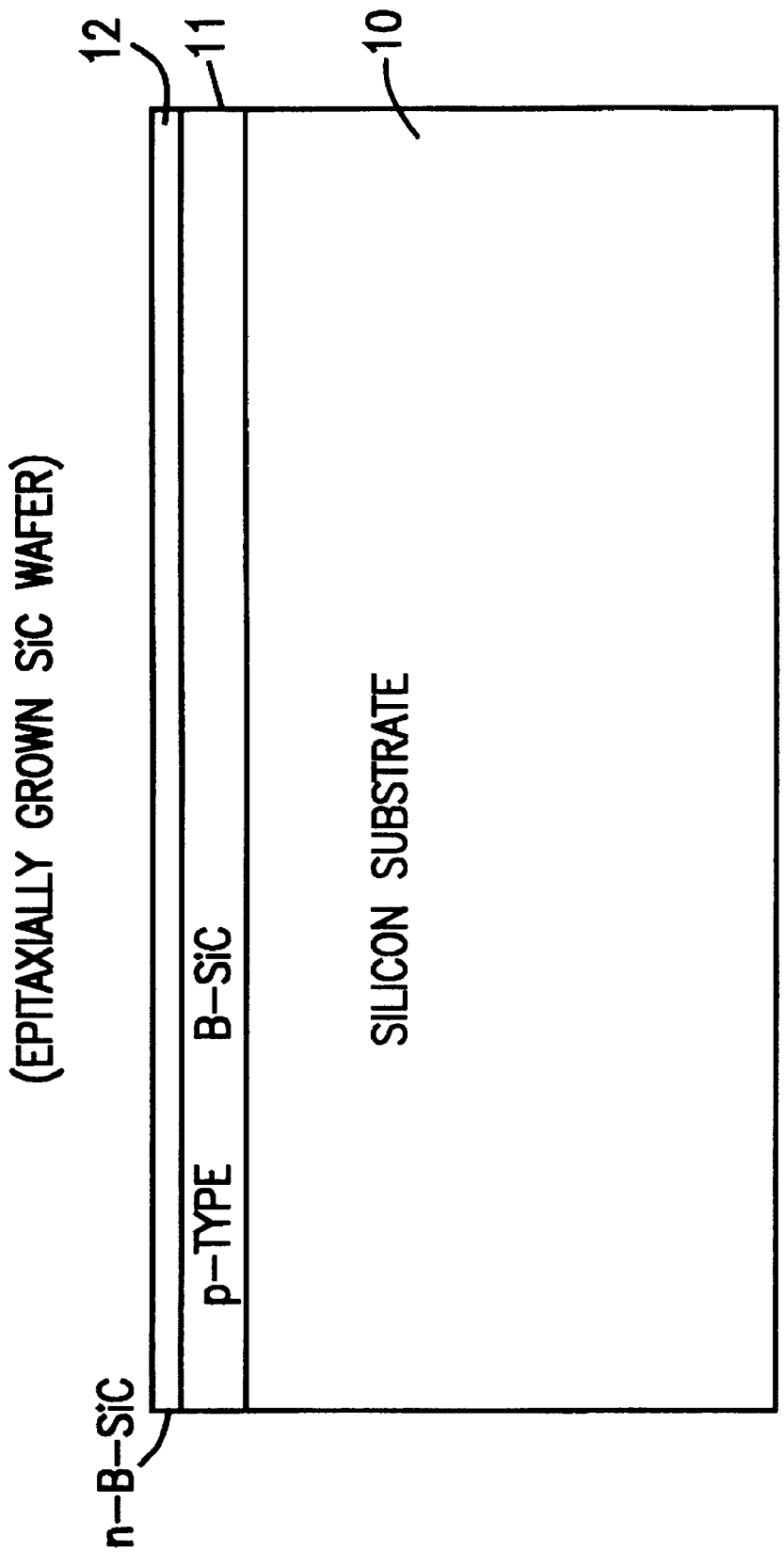
Figure 5B:
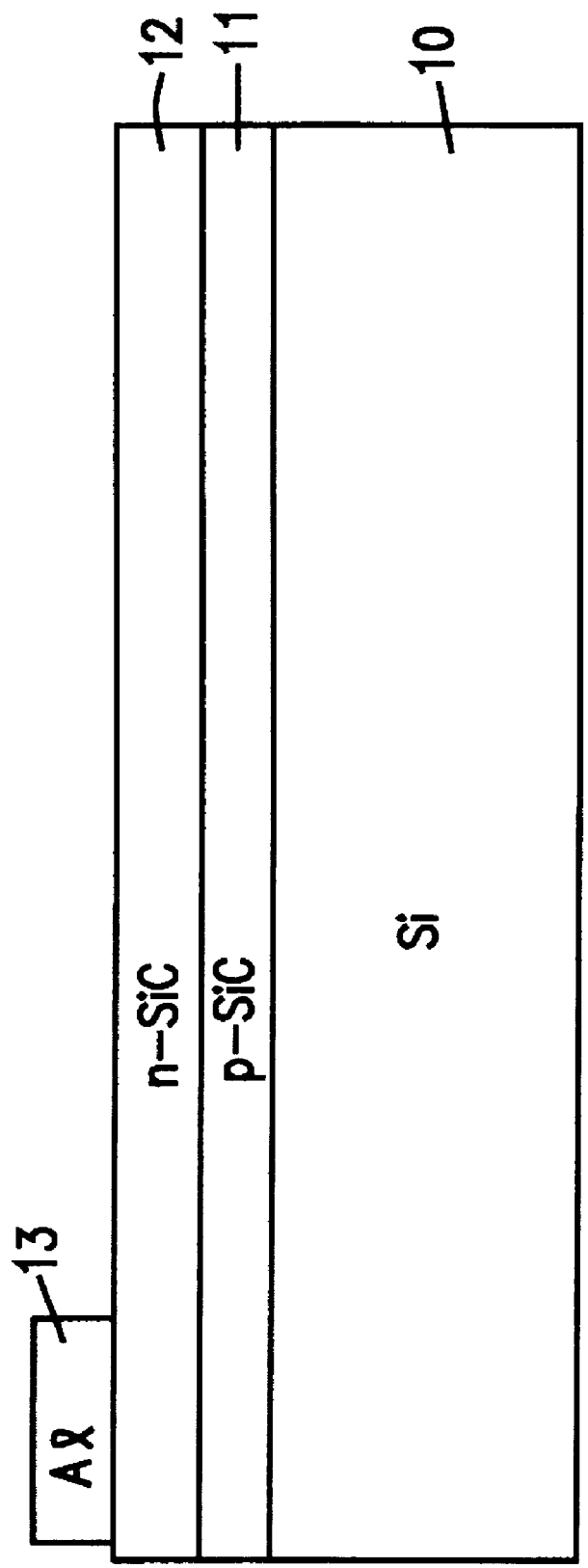

The stages of the process for selective conductivity etching of an Sic semiconductor are illustrated in FIGS. 5A–5E. Single crystal SiC layers may be epitaxially grown on substrates by chemical vapor deposition (CVD), as described in the previously mentioned article by J. A. Powell et al. The substrate may be any suitable material such as silicon (Si), titanium carbide (TiC), sapphire, α-SiC, or bulk β-SiC grown by the sublimation method or any other suitable method. In FIG. 5A, a β-SiC layer 11 is shown epitaxially grown on a silicon substrate 10 and doped for p-type conductivity. Afterwards, the β-Sic layer 12 is grown on the p-type layer 11 and doped for n-type conductivity. In FIG. 5B, a metal (aluminum) layer is then deposited on the n-type layer 12 and patterned to form an ohmic contact 13 with the remainder of the semiconductor surface exposed for etching. Examples of other metals that may be used include titanium, chromium (Cr), and molybdenum (Mo). External leads are attached to the metal contact 13 for applying a bias voltage to the n-type layer during photoelectrochemical etching.

Figure 5C:
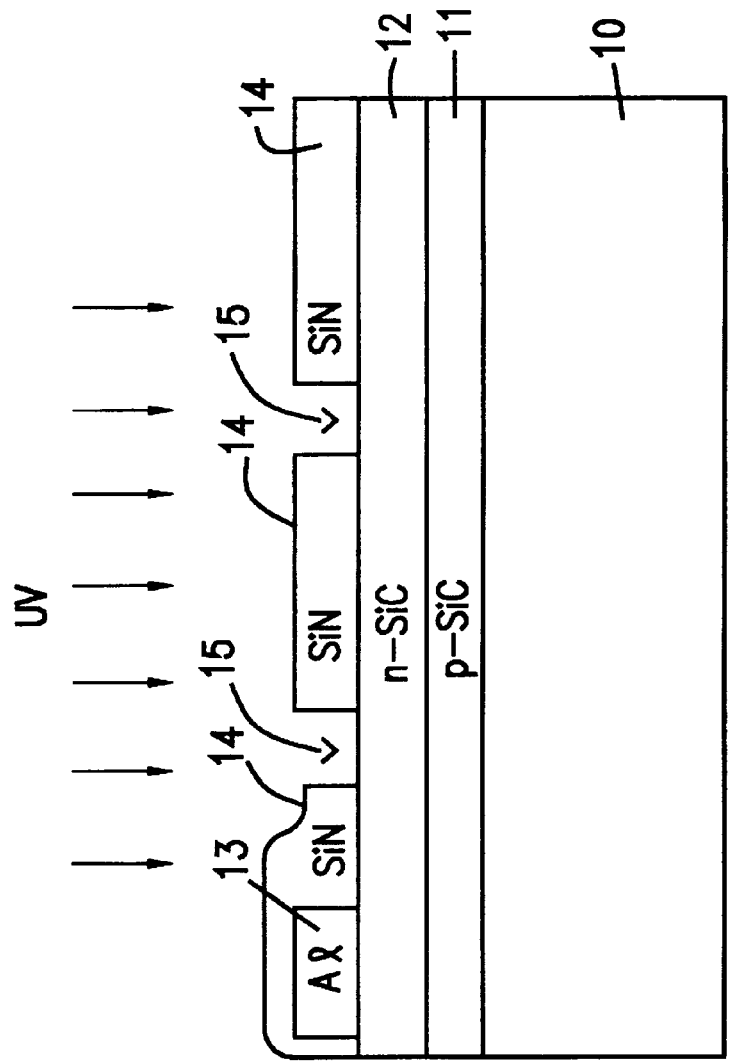

In FIG. 5C, a masking (silicon nitride, or Cr) layer is applied over the upper surface of the SiC semiconductor and patterned into the desired pattern design using standard photolithographic techniques. The masking material is selected to be able to withstand the HF electrolyte used in the semiconductor etching and not to decompose under intense UV illumination. Examples of suitable masking materials include SiN, Pt, and Cr. If chromium is used, it can serve as both the masking material and the ohmic contact described above. The mask patterning forms the desired SiN pattern layers 14 and exposure wells 15.

Figure 2C:
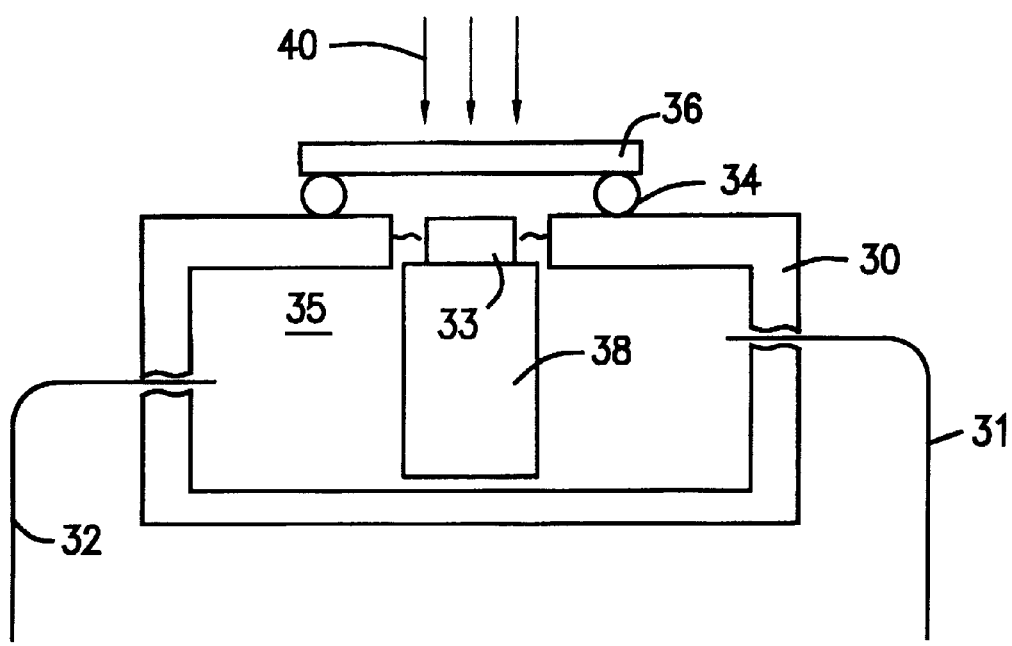
FIG. 2C illustrates a photoelectrochemical cell as used for the selective conductivity etching process of the present invention.

The masked SiC semiconductor is then placed in an electrochemical cell, such as the cell 30 illustrated in FIG. 2C. The cell walls may be made of an electrolyte-resistant, dielectric material, such as Teflon™ plastic material (trademark of DuPont Company). The cell 30 has leads for a platinum counter electrode 32 and a saturated calomel reference electrode 31. The electrolyte 35 used in the cell may be a dilute 2.5% HF or any other acidic solution containing $F^-$ or $Br^-$ ions or otherwise capable of dissolving $SiO_2$. The semiconductor is mounted in a carrier 33 which is positioned on a pedestal 38 in the cell 30. The semiconductor acts as the working electrode in this arrangement. Care must be taken that all surfaces not to be etched which may corrode in the electrolyte be covered with black wax or other encapsulant.

The semiconductor is preferably biased with respect to the saturated calomel reference electrode at a suitable potential for the n-type layer to photo-corrode and the p-type layer to remain inert. For the examples described below with respect to β-SiC n-p junctions, the bias potential applied to the n-type layer is preferably in the range of 0.5–1.4 $V_{sce}$ in 2.5% HF. However, it is possible to extend this range in both directions. For example, using higher quality β-SiC crystals, the n-type layer may etch at potentials as low as –0.5 $V_{sce}$. Also, the p-type material might remain inert at potentials as high as 1.5–3.5 $V_{sce}$ if there is a potential drop across the n-p junction which will cause the potential drop across the p-type semiconductor/electrolyte junction to be below the 1.5 $V_{sce}$ voltage level at which the p-type material will corrode. If very high quality crystals are used, it may not be necessary to bias the semiconductor at all, and the selective conductivity etching and etch-stopping effects may take place at open circuit potential due to the energy band-bending difference of the n-type and p-type materials in the electrolyte solution.

The semiconductor is subjected to electrochemical etching in the electrolyte 35 preferably while being exposed to UV light. UV light is provided from a UV light source 40 through a light-transmissive cover 36 sealed to the top of the cell 30 through seals 34. The UV exposure generates holes in the n-type layer 12 in the areas under the exposure wells 15. The etch rates are controlled by the light intensity and the anodic bias potential. After the sample has been illuminated for a sufficient time, the patterned design of the mask layer 14 will be etched in the n-type layer, while the p-type layer will act as an etch-stop barrier. The result is the formation of the etched n-type β-SiC patterns 12a shown in FIG. 5D.

The photoelectrochemical etch patterns may be formed in other ways besides the photolithographic mask. Alternatively, the masking may be done by projecting a collimated light beam through a mask of the desired pattern and imaging the mask onto the semiconductor surface. As another approach, a focused micrometer-sized laser beam may be used to scan the semiconductor surface to form the desired patterned structures. This is referred to as laser direct-writing.

After the n-type layer has been properly etched, the mask 14 and ohmic contact 13 should be stripped using an appropriate dissolving solution. Afterwards, the finished SiC semiconductor may be oxidized in dry oxygen to an oxide thickness of 1000–2000 Angstroms to remove any residue that may be left by the etching process. The oxidized layer can be removed by dissolving in an HF bath. The pattern-etched SiC semiconductor product is shown in FIG. 5E.

The following specific examples illustrate the application of the method in accordance with the present invention. In the examples, the p-type layer was grown to 4 um thickness, and was doped in situ using 180 ppm trimethylaluminum (TMA). Afterwards, a 1 um n-type layer was grown on the samples with nitrogen (9 ppm) as the dopant gas. The carrier concentrations were approximately $10^{19}$–$10^{20}$ for the p-type layer and $10^{17}$–$10^{18}$ for the n-type layer. Aluminum was used as the ohmic contacts, and dilute HF (2.5% in water) was the electrolyte. The UV light source was a frequency-doubled $Ar^+$ laser at 257 nm focused down to a 2–3 um spot. Etched trenches were formed by scanning the laser beam over the samples while applying an anodic bias potential. The dwell time of the laser was calculated by dividing the spot size by the scan speed. A scanning electron microscope (SEM) was used to measure the depths of the etch features. Etch rates were calculated by dividing the trench depths by the dwell times.

The anodic I–V curves for the n-type and p-type β-SiC layers in 2.5% HF are shown in FIGS. 2A and 2B. Below the anodic potential of 1.4 $V_{sce}$, the current densities in the p-type β-SiC layer was below a nominal 10 $uA/cm^2$. This corresponds to an etch rate of about 1 Angstrom per minute, assuming 8 equivalents/mole and 100% etch efficiency for the dissolution of SiC. Above this potential the current densities in the p-type layer increased dramatically, and rapid anodic dissolution took place. For the n-type β-SiC layer, the photo-generated current densities rose with the anodic potential at about 0.5 $V_{sce}$, and levelled off at about 6 $A/cm^2$ with the anodic potential at about 1.0 $V_{sce}$. For the n-type samples, the dark currents were below 4 $uA/cm^2$ between 0–4 $V_{sce}$.

These I–V curves were in agreement with the surface band-bending characteristics illustrated in FIGS. 1A and 1B. From the I–V curves, it is apparent that the n-type β-Sic epilayer can be etched from the p-type layer at potentials between 0.5–1.4 $V_{sce}$. The etch-stop effect in the p-type material ceased when the anodic potential was increased near the flatband voltage (1.45 volts in FIG. 1B). Efficient etching occurred in the n-type material under illumination at potentials of about 1 volt above the flatband voltage. This potential was well below the minimum voltage for dark p-type etching. Other experiments have shown that large photo-etch rates (1–100 um/min) can be achieved in the n-type β-SiC at 1 $V_{sce}$. The anodic I–V curves for β-SiC suggest that at this potential a selectivity greater than $10^6$ can be obtained. The large band-bending required for n-type material to etch may be attributed to minority carrier recombination in the space charge layer due to recombination centers caused by the high defect density of β-SiC grown on Si substrate. This recombination will cause poor collection efficiency at low surface band-bending.

Figure 3:
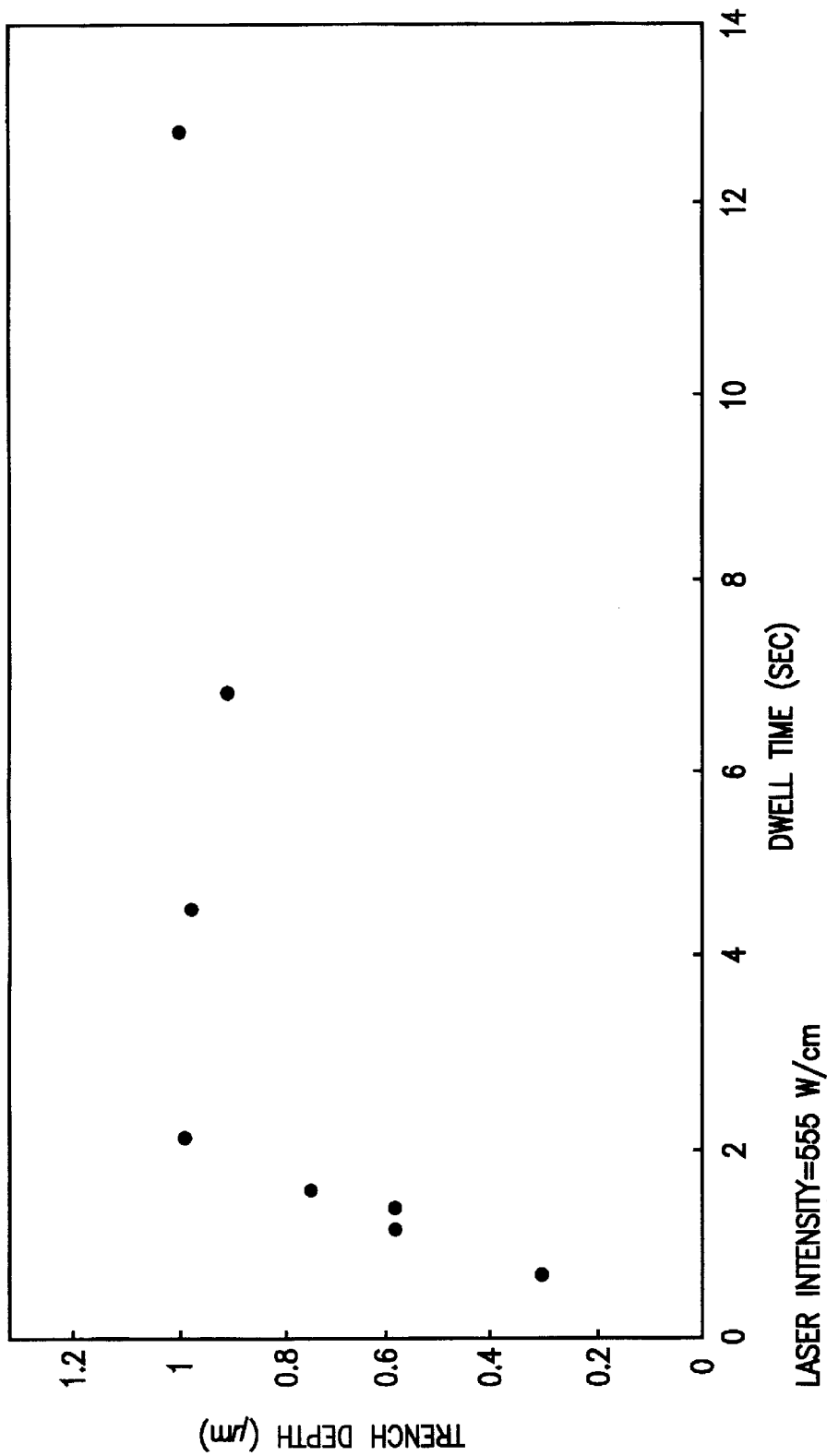
FIG. 3 is a diagram illustrating etching trench depths at a range of light (UV laser) exposure times for selective conductivity etching of the SiC semiconductor.

FIG. 3 shows the etched depth versus dwell time for the samples of n-type on p-type β-SiC. The diagram shows that once the 1 um depth, n-type layer was etched through, further etching into the p-type material did not occur. A dwell time of about 2 seconds was sufficient to etch through this depth. No dark etching was observed in the p-type underlayer even after the samples were biased in the electrolyte for more than 30 minutes. The diagram also shows that the etching of the n-type material proceeded in a linear fashion for depths less than 1 um, which implies that the etch rate (25 um/min) stayed constant as the layer was being removed.

Figure 4A:
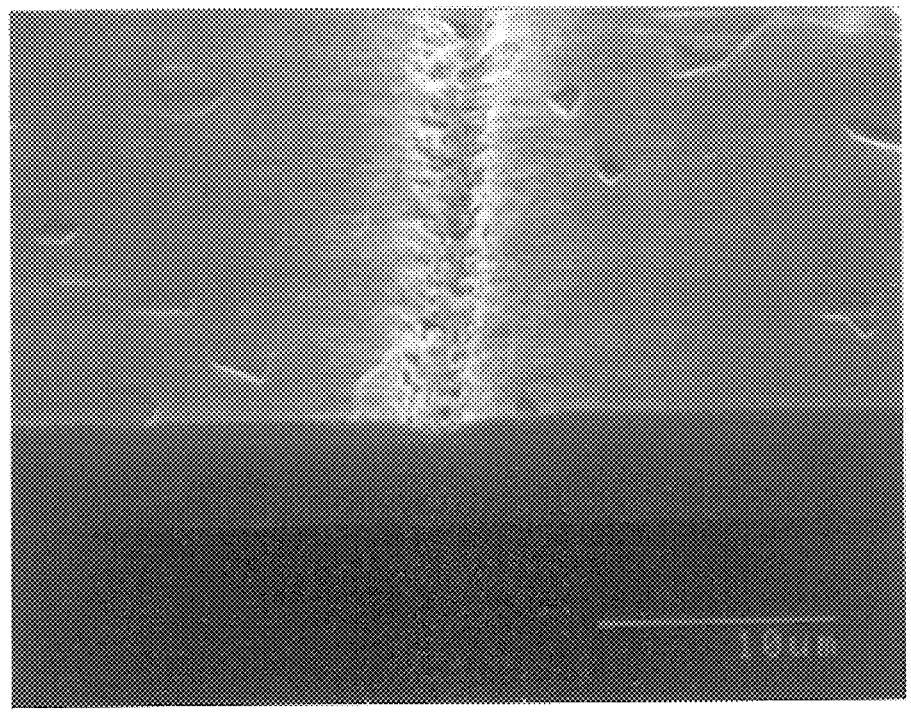
FIGS. 4A–4C are electron micrographs of etched patterns in the SiC semiconductor obtained in accordance with the present invention.
Figure 4B:
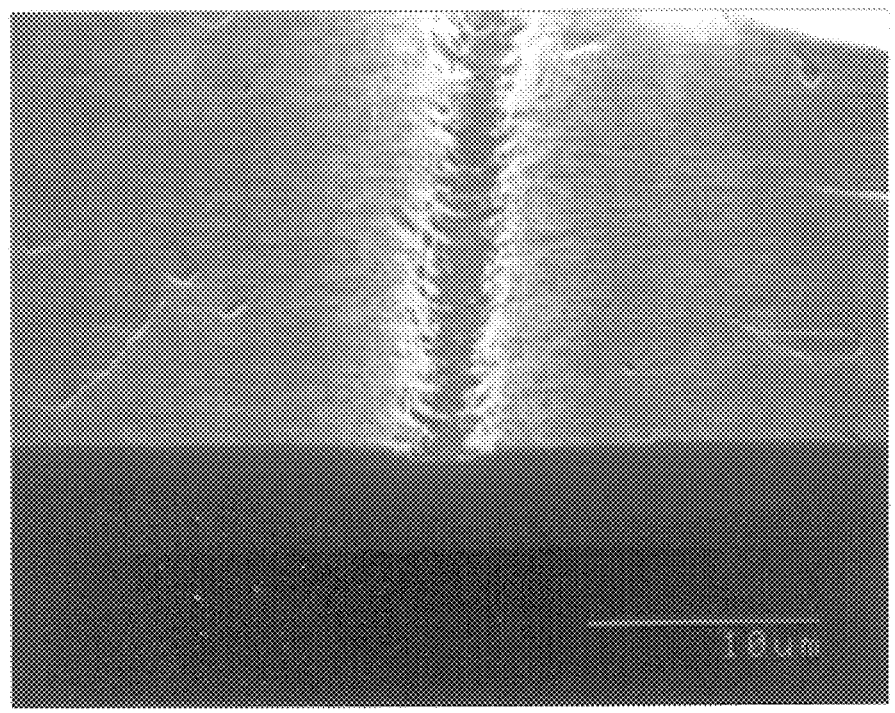
Figure 4C:
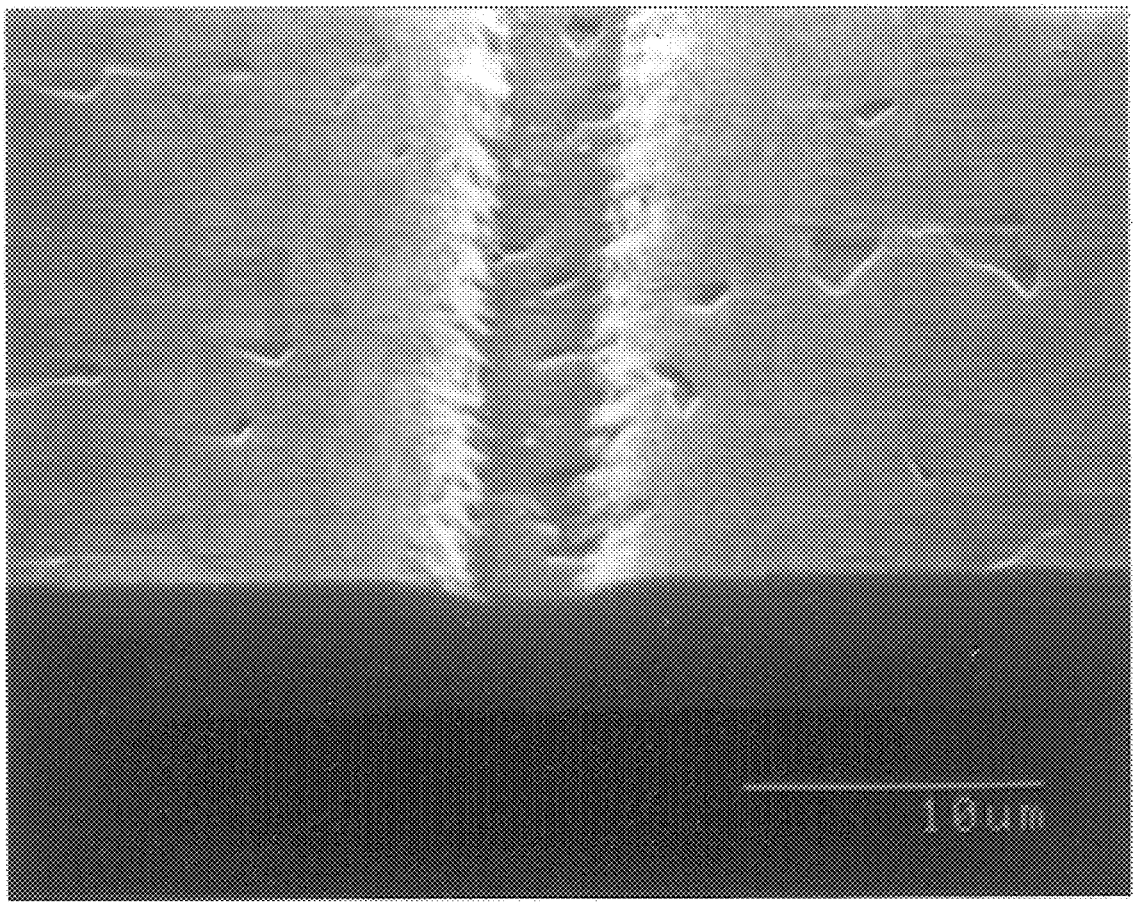

The progress of etching through the n-type layer and the etch stopping at the p-type layer was recorded in the electron micrographs shown in FIGS. 4A–4C. The samples were fabricated at similar laser intensities but at different dwell times. The samples were placed into the SEM without any presputtered metal films on them so that the n-type and p-type materials would appear to have different shades. The dwell time was 1.58 seconds in FIG. 4A (n-type region partially etched), 2.17 seconds in FIG. 4B (n-type region etched through to p-type etch stop), and 4.54 seconds in FIG. 4C (n-type layer has been removed and etching has stopped completely).

We have developed an ohmic contact metallization on n-type β-SiC that will withstand more than 15 hrs. at 650° C. in air without significant deterioration of the contact resistivity. This contact metallization involves sputtering a layer of Ti, typically 400 Å thick directly onto the n-type β-SiC layer. Following this, a layer of Titanium Nitride (typically 1000 Å thick) is reactively sputtered onto the Ti layer. Then a layer of Pt (typically 6000 Å) is sputtered on top of the TiN and a thin Au layer (300 Å) is sputtered on top of the Pt. The films are typically deposited in a sputter system such as the CVC sputter machine at a background pressure of $10^{-7}$ mbar. The system is purged with Argon for 20 min. before film deposition. The Ti can be deposited at an Ar pressure of 15 $\mu$m from a 5.5 inch target at a power of 500 W and a deposition rate of 100 Å/min. TiN is deposited under similar conditions from a Ti target, but the gas used is 20% Nitrogen and 80% Ar to cause TiN to form on the sample surface. Under these conditions the deposition rate is about 150 Å/min of 50%/50% TiN which has a bronze color. The Pt is deposited, also from a 5.5 inch target at 500 W in a 15 $\mu$m Ar pressure, resulting in a deposition rate of 300 Å/min. Under these conditions, Au deposits at a rate of 150 Å/min. The Ti layer, when annealed above 350° C. forms TiC, which acts as the ohmic contact to n-type β-SiC. Ti or TiC, as an ohmic contact to n-type β-SiC, has been extensively discussed in the literature (see for example J. J. Bellina and M. V. Zeller in "Novel Refractory Semiconductors" ed. by D. Emin, T. L. Aselage and C. Wood, Materials Research Society Press, 1987, p. 265). The Pt layer is a highly conductive layer which can be accessed by external leads using standard lead bonding techniques. The Au layer makes the lead bonding techniques easier to perform, but is not fundamentally necessary for the metallization system to work. The TiN layer, the fabrication of which is well known in the literature, serves as a diffusion barrier between the Ti and Pt layers (see C. Y. Ting and M. Wittmer in "Thin Solid Films", 96 (1982), p. 327–345). Without the TiN barrier the Ti/Pt/Au metallization system will fail completely at 650° C. in less than 2 hrs. With the TiN barrier in place, the Ti/TiN/Pt/Au metallization system is stable at 650° C. for over 15 hrs. Thus Ti/TiN/Pt/Au is a superior high temperature metallization system on n-type β-SiC due to the incorporation of the TiN diffusion barrier.

The above-described modes of practicing the invention are intended to be illustrative only, and many other variations and modifications may be made thereto in accordance with the principles of the invention. All such variations and modifications thereof are considered to be within the scope of the invention, as defined in the following claims.

We claim:

1. A method for fabricating a semiconductor by selectively etching, said method comprising the steps of:
    providing a substrate;
    forming a first semiconductor layer on said substrate, said first semiconductor layer comprising p-type silicon carbide, and requiring a first voltage for charge transport at a surface of said layer in a given electrolytic etching solution;
    forming a second semiconductor layer on said first layer, said second layer comprising n-type silicon carbide, and requiring a second voltage for charge transport at a surface of said second layer in said given electrolytic etching solution which is lower then said first voltage:
    placing said substrate into said given electrolytic etching solution;
    applying a bias voltage to said second semiconductor layer which is between said first and second voltages; and,
    creating charge holes in selected regions of said surface of said second semiconductor layer to promote etching of said regions to form said semiconductor, whereby said etching automatically stops when regions of said first semiconductor layer under said selected regions become exposed;
    wherein said applying said bias voltage comprises forming an ohmic contact on said second semiconductor layer through which said bias voltage is applied to said second semiconductor layer during etching, and said forming said ohmic contact comprises: depositing a layer of titanium onto said second semiconductor layer; depositing a layer of titanium nitride onto said layer of titanium; and depositing a layer of platinum onto said layer of titanium nitride.

2. The method according to claim 1, further comprising the step of purging each of said layers of said ohmic contact with argon gas.

3. The method according to claim 1, further comprising the step of depositing a layer of gold onto said layer of platinum.

4. A method for fabricating a semiconductor by selectively etching, said method comprising the steps of:
    providing a substrate;
    forming a first semiconductor layer on said substrate, said first semiconductor layer comprising p-type silicon carbide, and requiring a first voltage for charge transport at a surface of said layer in a given electrolytic etching solution;
    forming a second semiconductor layer on said first layer, said second layer comprising n-type silicon carbide, and requiring a second voltage for charge transport at a surface of said second layer in said given electrolytic etching solution which is lower then said first voltage;
    placing said substrate into said given electrolytic etching solution;
    applying a bias voltage to said second semiconductor layer which is between said first and second voltages;
    creating charge holes in selected regions of said surface of said second semiconductor layer to promote etching of said regions to form said semiconductor, whereby said etching automatically stops when regions of said first semiconductor layer under said selected regions become exposed; and,
    forming an oxidized layer over said second semiconductor layer and said exposed regions of said first semiconductor layer.

5. The method according to claim 4, further including the step of removing the said oxidized layer.

* * * * *